(12) United States Patent
Wang et al.

(10) Patent No.: US 12,160,985 B2
(45) Date of Patent: *Dec. 3, 2024

(54) SHARED BIT LINES FOR MEMORY CELLS

(71) Applicant: Taiwan Semiconductor Manufacturing Co., Ltd., Hsinchu (TW)

(72) Inventors: Ping-Wei Wang, Hsin-Chu (TW); Chih-Chuan Yang, Hsinchu (TW); Lien Jung Hung, Taipei (TW); Feng-Ming Chang, Hsinchu County (TW); Kuo-Hsiu Hsu, Taoyuan County (TW); Kian-Long Lim, Hsinchu (TW); Ruey-Wen Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/151,991

(22) Filed: Jan. 9, 2023

(65) Prior Publication Data

US 2023/0164971 A1 May 25, 2023

Related U.S. Application Data

(63) Continuation of application No. 17/248,112, filed on Jan. 8, 2021, now Pat. No. 11,552,084.

(Continued)

(51) Int. Cl.
| | | |
|---|---|---|
| *G11C 11/41* | (2006.01) | |
| *G11C 11/418* | (2006.01) | |
| *H01L 23/528* | (2006.01) | |
| *H01L 29/06* | (2006.01) | |
| *H01L 29/423* | (2006.01) | |

(Continued)

(52) U.S. Cl.
CPC .......... *H10B 10/125* (2023.02); *G11C 11/418* (2013.01); *H01L 23/5283* (2013.01); *H01L 23/5286* (2013.01); *H01L 29/0673* (2013.01); *H01L 29/42392* (2013.01); *H01L 29/66742* (2013.01); *H01L 29/78618* (2013.01); *H01L 29/78696* (2013.01)

(58) Field of Classification Search
None
See application file for complete search history.

(56) References Cited

U.S. PATENT DOCUMENTS

| | | |
|---|---|---|
| 5,554,870 A | 9/1996 | Fitch |
| 6,021,064 A | 2/2000 | McKenny |

(Continued)

FOREIGN PATENT DOCUMENTS

| | | |
|---|---|---|
| CN | 106816440 A | 6/2017 |
| CN | 107771348 A | 3/2018 |

(Continued)

*Primary Examiner* — Tan T. Nguyen
(74) *Attorney, Agent, or Firm* — Haynes and Boone, LLP

(57) ABSTRACT

Methods and devices including a plurality of memory cells and a first bit line connected to a first column of memory cells of the plurality of memory cells, and a second bit line connected to the first column of cells. The first bit line is shared with a second column of memory cells adjacent to the first column of memory cells. The second bit line is shared with a third column of cells adjacent to the first column of cells opposite the second column of cells.

20 Claims, 12 Drawing Sheets

Related U.S. Application Data

(60) Provisional application No. 63/002,953, filed on Mar. 31, 2020.

(51) Int. Cl.
*H01L 29/66* (2006.01)
*H01L 29/786* (2006.01)
*H10B 10/00* (2023.01)

(56) References Cited

U.S. PATENT DOCUMENTS

| | | | |
|---|---|---|---|
| 6,980,462 B1 | 12/2005 | Ramesh | |
| 7,092,279 B1 | 8/2006 | Sheppard | |
| 7,505,328 B1 | 3/2009 | Torii | |
| 7,567,457 B2 * | 7/2009 | Nazarian | G11C 8/14 365/72 |
| 11,145,734 B1 * | 10/2021 | Yu | H01L 21/823481 |
| 11,552,084 B2 * | 1/2023 | Wang | H01L 23/5286 |
| 2005/0253143 A1 | 11/2005 | Takaura | |
| 2008/0049500 A1 | 2/2008 | Kato | |
| 2009/0046514 A1 | 2/2009 | Yamamoto | |
| 2009/0109758 A1 | 4/2009 | Nazarian | |
| 2009/0207656 A1 | 8/2009 | Kuo | |
| 2010/0027312 A1 | 2/2010 | Khanuja | |
| 2010/0195365 A1 | 8/2010 | Thyagarajan | |
| 2010/0246152 A1 | 9/2010 | Lin | |
| 2013/0272056 A1 | 10/2013 | Liaw | |
| 2015/0109847 A1 | 4/2015 | Hu | |
| 2015/0235940 A1 | 8/2015 | Chen | |
| 2016/0087059 A1 | 3/2016 | Hsieh | |
| 2016/0193012 A1 | 7/2016 | Anderson | |
| 2018/0122793 A1 | 5/2018 | Moroz | |
| 2021/0375722 A1 | 12/2021 | Kim | |
| 2021/0375883 A1 | 12/2021 | Hsu | |
| 2021/0391325 A1 | 12/2021 | Su | |
| 2022/0037337 A1 | 2/2022 | Wang | |
| 2022/0238699 A1 * | 7/2022 | Chiang | H01L 27/0886 |

FOREIGN PATENT DOCUMENTS

| | | |
|---|---|---|
| CN | 109309092 A | 2/2019 |
| CN | 110034118 A | 7/2019 |
| TW | 201418026 A | 5/2014 |
| TW | I700701 B | 8/2020 |
| WO | 2019142670 A1 | 7/2019 |

* cited by examiner

SHARED BIT LINES FOR MEMORY CELLS

PRIORITY DATA

This application is a continuation application of U.S. patent application Ser. No. 17/248,112, filed Jan. 8, 2021, issuing as U.S. Pat. No. 11,552,084, which claims the benefit of U.S. Provisional Application 63/002,953 entitled "Super Power Rail in SRAM Design," filed Mar. 31, 2020, the disclosure of which is hereby incorporated by reference in its entirety.

BACKGROUND

Integrated circuits have progressed to advanced technologies with smaller feature sizes, such as 7 nm, 5 nm and 3 nm. In these advanced technologies, the gate pitch (spacing) continuously shrinks and therefore induces contact to gate bridge concern. Furthermore, three dimensional transistors with fin-type active regions are often desired for enhanced device performance. Those three-dimensional field effect transistors (FETs) formed on fin-type active regions are also referred to as FinFETs. FinFETs are required narrow fin width for short channel control, which leads to smaller source/drain regions than those of planar FETs. This will reduce the alignment margins and cause issues for further shrinking device pitches and increasing packing density. Along with the scaling down of the device sizes, power lines are formed on the backside of the substrate. However, the existing backside power rails still face various challenges including routing resistance, alignment margins, layout flexibility, and packing density. Therefore, there is a need for a structure and method for fin transistors and power rails to address these concerns for enhanced circuit performance and reliability.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
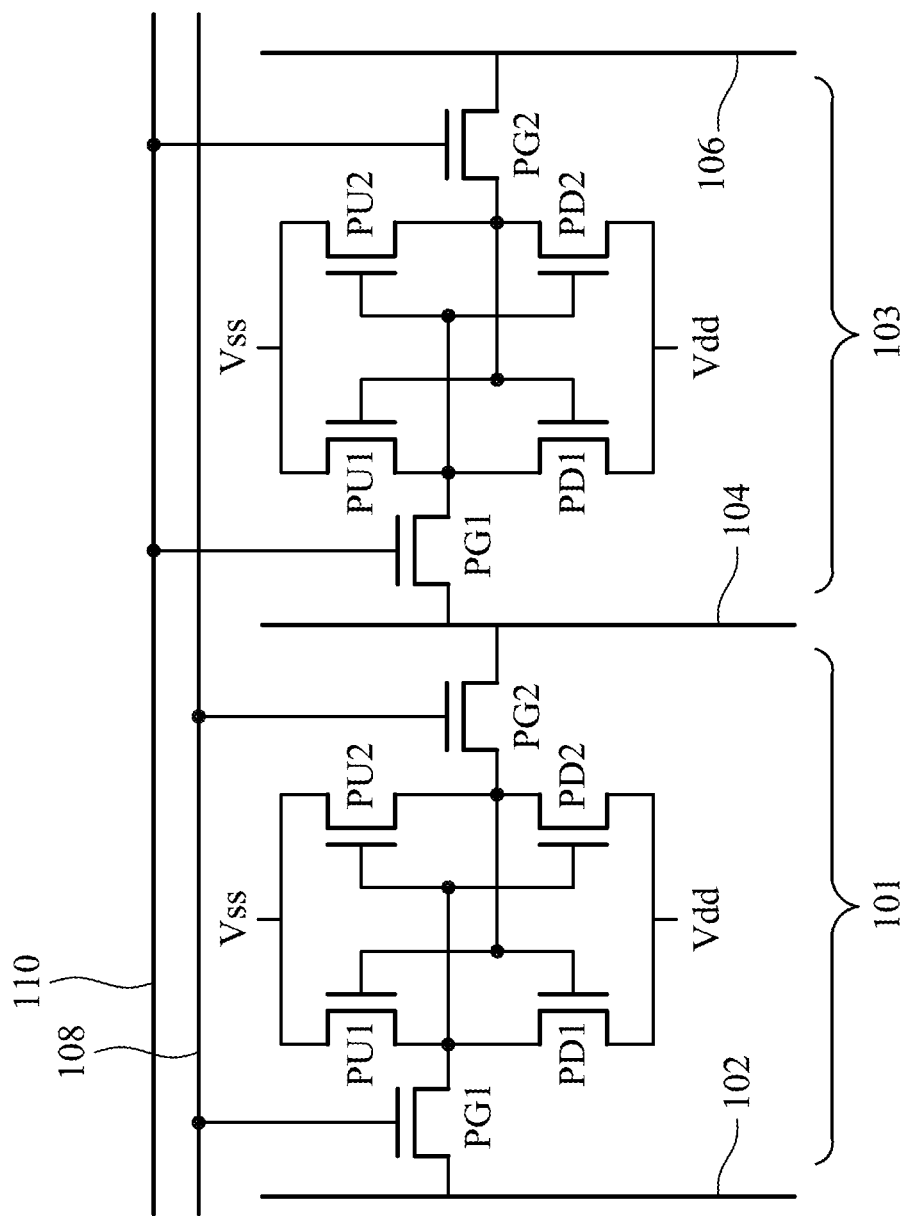
FIG. 1 is a circuit diagram showing an illustrative set of memory cells in which bit lines are shared, according to one example of principles described herein.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact and may also include embodiments in which additional features may be formed interposing the first and second features, such that the first and second features may not be in direct contact.

Semiconductor fabrication involves the formation of a wide variety of circuits. One type of circuit is a memory array. A memory array typically includes a plurality of memory cells arranged in a two dimensional array. In one direction of the two-dimensional array, cells are connected along bit lines. In a second direction, orthogonal to the first direction, cells are connected along word lines. For purposes of discussion, a line of cells in the first direction will be referred to as a column, and a line of cells along the second direction will be referred to as a row. Generally, a particular row is associated with a digital word, and each column corresponds to a different bit within that word.

Conventionally, to access a specific cell within a memory array, a signal (e.g., voltage or current) is applied to the bit line and the word line connected to that cell. Accessing a particular cell may involve reading or writing to the data stored in that cell. Each cell may store either a digital "1" or a digital "0" based on the state of the transistors within that cell.

One type of memory array is a Static Random Access Memory (SRAM) array. In some memory cell designs, each cell utilizes two separate bit lines, often referred to as the bit line (BL) and the bit line bar (BLB). Both the bit line and the bit line bar extend along the columns of a memory cell. Also extending along the same direction as the bit lines are the power rails. The power rails include a Vss line and a Vdd line.

In such designs, each cell has two bit lines, a Vdd line, and two Vss lines extending in the same direction through each cell. As the size of memory arrays shrink, it becomes more difficult to manufacture such small metal lines. Moreover, the smaller metal lines may be less conductive and have a higher capacitance, which degrades performance.

According to principles described herein, to allow space for larger metal lines and improved performance, each bit line and bit line bar is shared with an adjacent memory cell. For example, in a particular column of memory cells, the bit line for that column may be shared with an adjacent column on one side. Additionally, the bit line bar for that column may be shared by another column of memory cells on the opposite side. By sharing the bit line and the bit line bar, such lines can be made larger than otherwise allowed. This larger size decreases resistance and capacitance, which thereby improves performance. Because bit lines are shared by adjacent cells, two word lines are formed through each cell within a row (as opposed to the conventional case where only one word line extends through a row of cells. Each of the word lines may alternate connections in a staggered manner so as to allow for individual selections of the bits within a particular word.

Additionally, in some implementations, the Vss lines may be shared in a similar manner. In one example, the Vss lines may extend along a backside of the wafer on which the transistors of the memory cells are formed, while the bit line and bit line bar are formed on the front-side of the wafer. Alternatively, the bit line and bit line bar (as well as the Vdd line) may be formed on the back-side of the wafer while the Vss lines are formed on the front-side of the wafer.

By utilizing principles described herein, and sharing the lines (bit lines or power lines) with adjacent cells, improved performance of SRAM cells can be realized without increasing the size of each cell. Specifically, for example, the larger-sized bit lines, which are shared by adjacent columns, allow for reduced resistance and capacitance. The reduced capacitance and resistance substantially improves performance of the device. Specifically, data can be read from or written to the SRAM cells at a higher rate of speed.

FIG. 1 is a circuit diagram showing an illustrative set of memory cells in which bit lines are shared. According to the present example, FIG. 1 illustrates the circuit diagrams for two adjacent memory cells 101, 103. The first memory cell 101 is connected to a first bit line 102 and a second bit line 104. In one example, the first bit line is BL and the second bit line is BLB. Additionally, the first memory cell 101 is connected to word line 108, but is not connected to word line 110. Thus, while both word lines 108, 110 are associated with the row in which the memory cells 101, 103 are positioned, the first memory cell 101 is only connected to one of the two word lines.

In more detail the first memory cell 101 connects to the first bit line 102 through the source of a first pass gate transistor PG1. The gate of the pass gate transistor PG1 is connected to the first word line 108. The drain of the pass gate transistor PG1 connects to the drain of a first pull-up transistor PU1, a source of a first pull-down transistor PD1, the gate of a second pull-up transistor PU2, and the gate of a second pull-down transistor PD2. The source of the pull-up transistor PU1 is connected to Vss and the drain of the pull-down transistor PD1 is connected to Vdd. Similarly, the source of the pull-up transistor PU2 is connected to Vss and the drain of the pull-down transistor PD2 is connected to Vdd. Furthermore, the gate of the pull-up transistor PU1, the gate of the pull-down transistor PD1, the drain of the pull-up transistor PU2, and the source of the pull-down transistor PD2 are all connected to the source of a second pass-gate transistor PG2. The gate of the second pass-gate transistor PG2 is also connected to the word line 108. The drain of the pass-gate transistor PG2 is connected to the second bit line 104.

The second memory cell 103 is connected to bit line 104, which is shared with the first memory cell. The second memory cell 103 is also connected to another bit line 106. In this example, bit line 104 is BLB and bit line 106 is BL. Additionally, the second memory cell 103 is connected to word line 110, but is not connected to word line 108. Thus, while both word lines 108, 110 are associated with the row in which the memory cells 101, 103 are positioned, the second memory cell 103 is only connected to one of the two word lines.

In more detail the second memory cell 103 connects to the bit line 104 through the source of a first pass gate transistor PG1. The gate of the pass gate transistor PG1 is connected to the second word line 110. The drain of the pass gate transistor PG1 connects to the drain of a first pull-up transistor PU1, a source of a first pull-down transistor PD1, the gate of a second pull-up transistor PU2, and the gate of a second pull-down transistor PD2. The source of the pull-up transistor PU1 is connected to Vss and the drain of the pull-down transistor PD1 is connected to Vdd. Similarly, the source of the pull-up transistor PU2 is connected to Vss and the drain of the pull-down transistor PD2 is connected to Vdd. Furthermore, the gate of the pull-up transistor PU1, the gate of the pull-down transistor PD1, the drain of the pull-up transistor PU2, and the source of the pull-down transistor PD2 are all connected to the source of a second pass-gate transistor PG2. The gate of the second pass-gate transistor PG2 is also connected to the word line 110. The drain of the pass-gate transistor PG2 is connected to bit line 106.

Figure 2:
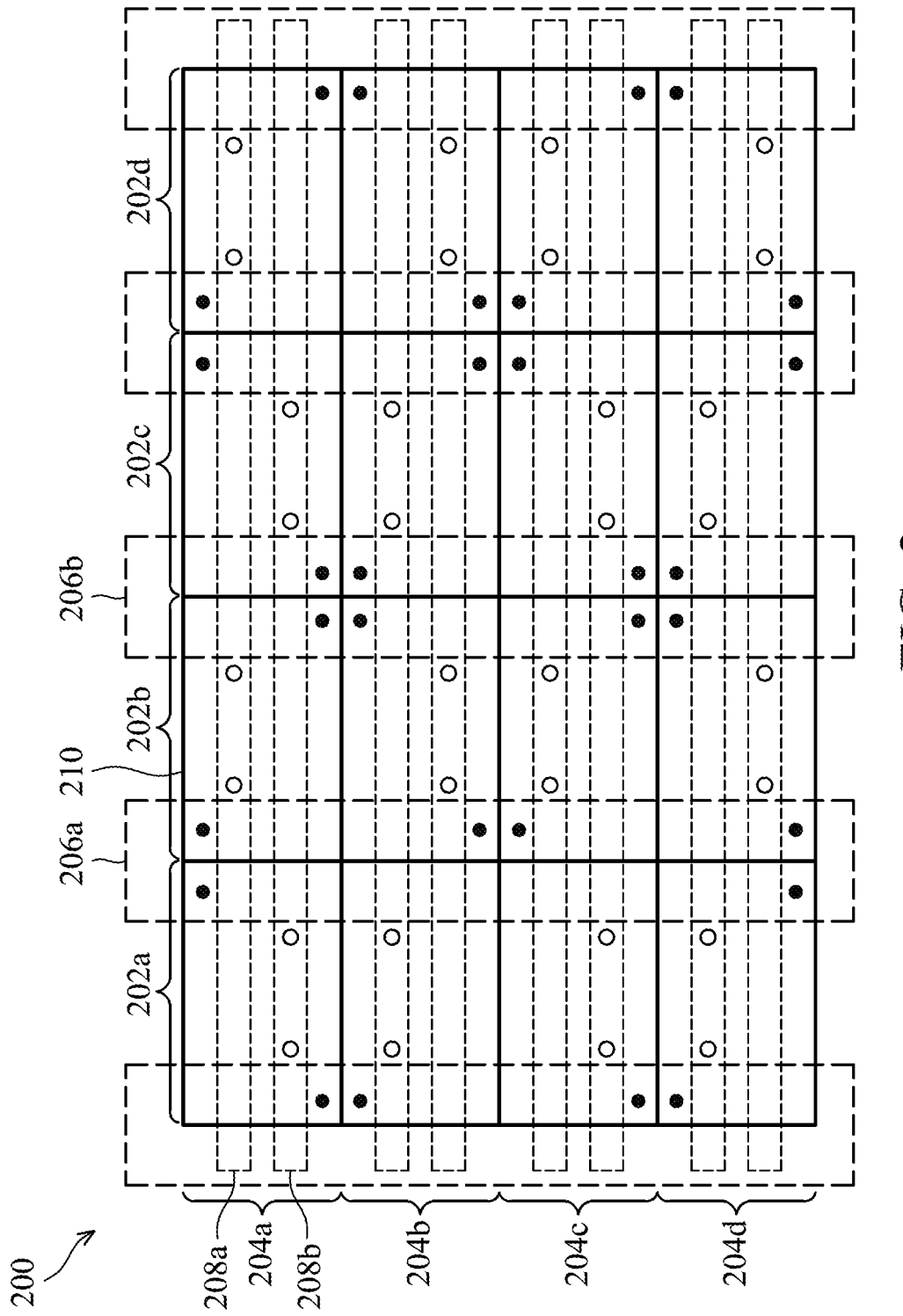
FIG. 2 is a diagram showing an illustrative memory array with shared bit lines, according to one example of principles described herein.

FIG. 2 is a diagram showing an illustrative memory array 200 with shared bit lines. FIG. 2 illustrates a two-dimensional array of memory cells. While FIG. 2 illustrates a 4×4 memory array, it is understood that the principles described herein are applicable to larger memory arrays.

FIG. 2 illustrates memory cells laid out in a set of columns 202a, 202b, 202c, 202d, and rows 204a, 204b, 204c, 204d. Bit lines (including bit lines 206a, 206b) are shown in dotted boxes extending parallel to the columns 202a, 202b, 202c, 202d. Word lines (including word lines 208a, 208b) are shown in dotted boxes extending parallel to the rows 204a, 204b, 204c, 204d. Connections from bit lines to a particular memory cell are shown with filled in dots. Connections from word lines to a particular memory cell are shown with the empty circles. The bit lines (including bit lines 206a, 206b) are wider than the word lines (including word lines 208a, 208b). In an embodiment, the width of the word line is between approximately about 20-30 nanometers. In an embodiment, the width of the bit lines is between approximately 50 and 80 nanometers. In an embodiment, the bit lines are at least approximately 50% wider than the word lines. The width may be measured in the top view (e.g., parallel a top surface of the substrate the device is formed upon). The wider width of the bit lines serves to decrease resistance.

Attention is given to a particular memory cell 210 as an example. Memory cell 210 is positioned within column 202b and row 204a. Memory cell 210 connects to a first bit line 206a and a second bit line 206b. The first bit line 206a is shared by the memory cells within column 202a. In other words, columns 202a and 202b share bit line 206a. Additionally, memory cell 210 is connected to bit line 206b. Bit line 206b is shared with the memory cells in column 202c. In other words, bit line 206b is shared by columns 202b and 202c.

Additionally, each row of memory cells has two word lines passing therethrough. In the example of memory cell 210, word lines 208a and 208b pass through. However, memory cell 210 connects only to one of the two word lines 208a, 208b. Specifically, memory cell 210 connects to word line 208a. The adjacent memory cells within row 202a connect to word line 208b and do not connect with word line 208a. Thus, for a particular row, connections to the word lines alternate every other memory cell. For example, in row 202a, columns 202a and 202c connect to word line 208b. And, also in row 202a, columns 202b and 202b connect to word line 210a.

Figure 3A:
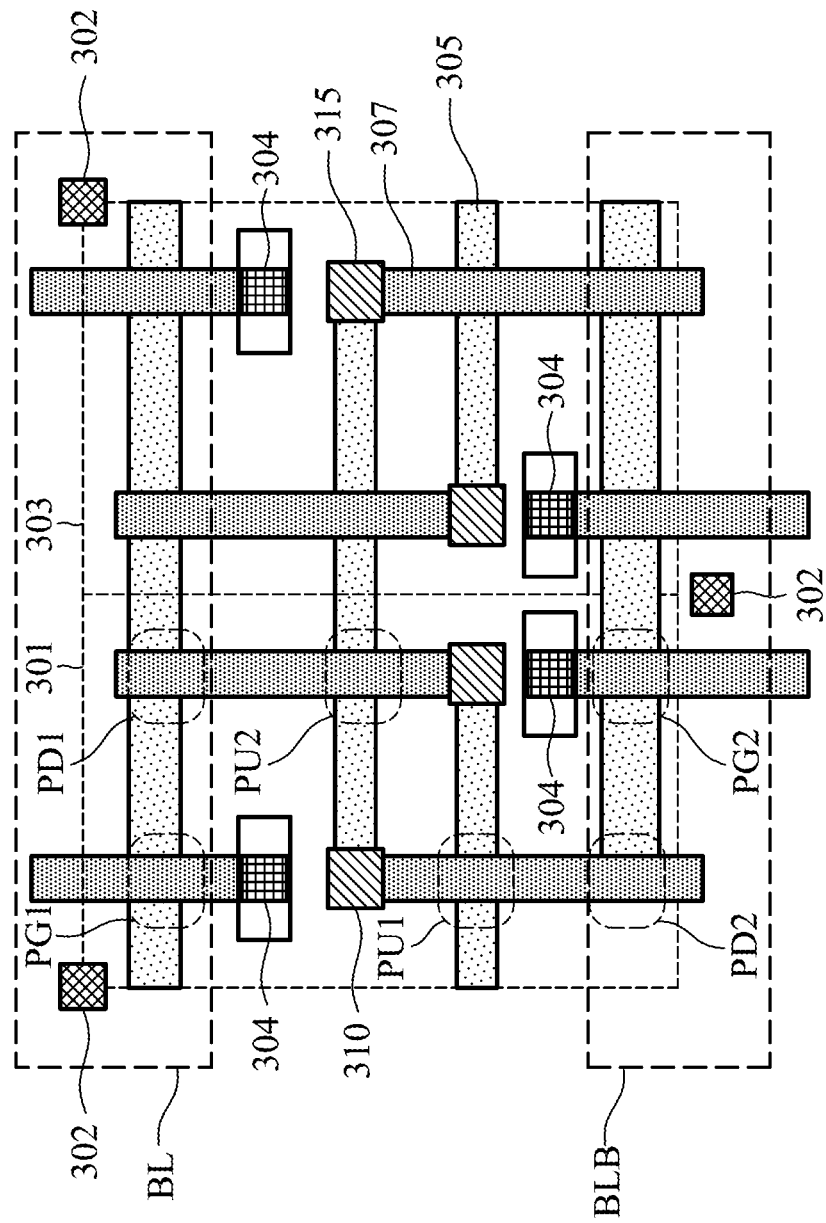
FIGS. 3A and 3B are diagrams showing an illustrative layout of memory cells that use shared bit lines, according to one example of principles described herein.
Figure 3B:
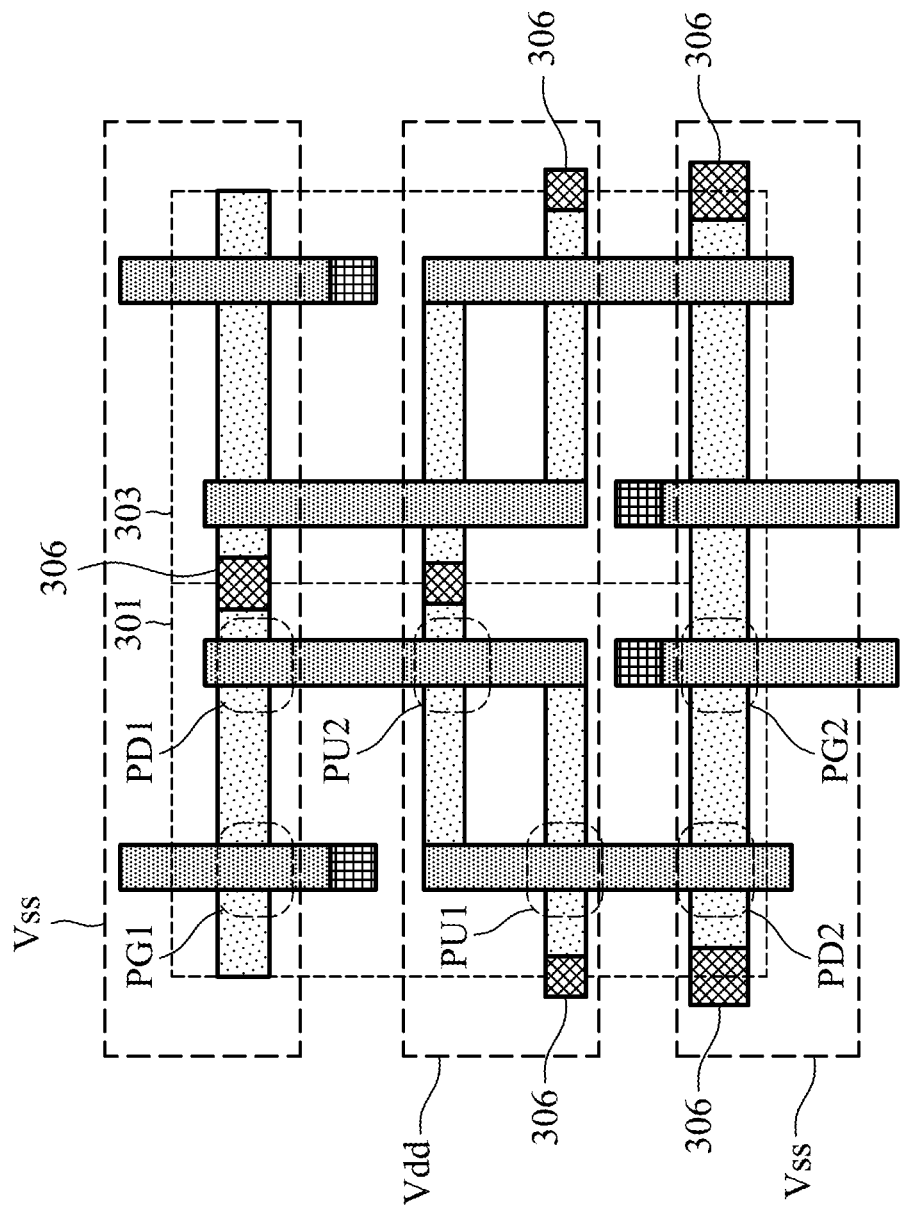

FIGS. 3A and 3B are diagrams showing an illustrative layout of memory cells that use shared bit lines. FIG. 3A illustrates the layout of active regions and gate structures for an SRAM memory cell layout. In particular, two adjacent cells 301, 303 are shown in FIG. 3A. For one memory cell 301, the location of the transistors PG1, PD1, PU2, PU1, PD2, and PG2 are shown. The transistors are formed where a gate structure crosses an active region. It is noted that cell 303 is symmetric (reflected across y-axis) to cell 301. Each cell (301 or 303) is symmetric within itself (reflected across an x-axis and a y-axis). The active regions are shown as elongated rectangles 305 extending in a first direction that is parallel to the bit lines BL/BLB. The widths of the active regions associated with NMOS devices may different from the widths of the active regions associated with PMOS devices. As illustrated in FIGS. 3A and 3B, the active regions at the top and bottom of the figures are wider (in the y-direction) than the center two active regions. The gate structures are shown as elongated rectangles extending 307 extending in a second direction that is orthogonal to the first direction. The word lines (not shown) extend in the second direction. In some implementations, the active region is a fin structure extending in the first direction.

The active regions may include semiconductor materials (e.g., fin structures) formed on a substrate and doped to form source/drain regions on both sides of a gate. The shallow trench isolation (STI) features may be formed to isolate the active regions from each other. In the present example, the active regions may be fin active regions extruded above the STI features. In some examples, the active regions may be alternatively planar active regions or active regions with multiple channels vertically stacked (also referred to gate-all-around (GAA) structure). The active regions on either side of a gate structure include sources (or referred to as source features) and drains (or referred to as drain features). The source features and the drain features are interposed by respective gate stacks to form various field-effect transistors (FETs). In the present embodiment, the active regions have an elongated shape oriented along the first direction (X direction) and the gate stacks have elongated shape oriented along the second direction (Y direction) that is orthogonal to the first direction.

FIG. 3A illustrates the layout with respect to the front-side of the substrate. In the present example, both the bit line BL and bit line bar BLB are formed on the frontside of the substrate or wafer. FIG. 3A also illustrates the locations of via connections 302, 304 that connect the transistors to the bit line BL or bit line bar BLB above. In particular, via connections 302 show where connections are made to either the bit line BL or bit line bar BLB. Via connections 304 show connections to word lines (not shown). In some examples, the word lines may be formed in a metallization layer above the bit lines BL/BLB.

In some examples, the via locations 302, 304 may connect to the upper metal lines through an interconnect structure (not shown). The interconnect structure may include various contact features, via features and metal lines to connect FETs and other devices into functional circuits. The interconnect structure may include multiple metal layers each having a plurality of metal lines and via features to vertically interconnecting the metal lines in the adjacent metal layers, such as the bit lines BL/BLB or the word lines.

In some examples, the contacts 310 may be butted contact features (BCT). The butted contact 310 may landing on an active region and a gate structure. For example, one butted contact 620 (the left in FIG. 3A) is connected to the common gate of the PU-1 and PD-2, and the source/drain features of the PU-2. Other butted contacts 310 similarly connect gate structures to an active region (source/drain feature) of an adjacent transistor. Butted contacts are referred to as such as they include a first contact portion extending to a gate (VG) and a second contact portion extending to a source/drain of the active region (VDR) combined together in one structure.

FIG. 3B illustrates the layout of the memory cells 301, 303 with respect to the backside of the substrate. In the present example, the backside of the substrate is processed to form the power lines Vss and Vdd. For each cell, there are two Vss lines and one Vdd line disposed on the backside of the substrate. Additionally, like the bit lines, which are shared, the Vss lines are also shared. Specifically, both of the Vss lines on both sides of the memory cells 301, 303 are shared with adjacent memory cells in adjacent columns. Again, memory cell 301 is symmetric to memory cell 303 (reflected across y-axis). Each memory cell (301, 303) is symmetric within the cell (reflected across the x-axis and the y-axis).

FIG. 3B illustrates the locations of the via connections 306 that connect to the power lines Vss/Vdd below. The via connections 306 have substantially the same width (e.g., in the y-direction) as the active regions that they are landing upon. Thus, in some implementations, the contact 306 interfacing the active regions of the PD-1 is larger (e.g., in the y-direction and the x-direction) than that of the contact 306 interfaces the active regions of PU-2. Similarly, the contact 306 interfacing the active region (source/drain feature) of the PD-2 is greater than the contact 306 interfacing the active region (source/drain feature) of the PU-1.

Such connections 306 may be formed by performing fabrication processes on the backside of the wafer. This is described in further detail below with reference to FIG. 7A-7G.

Figure 4A:
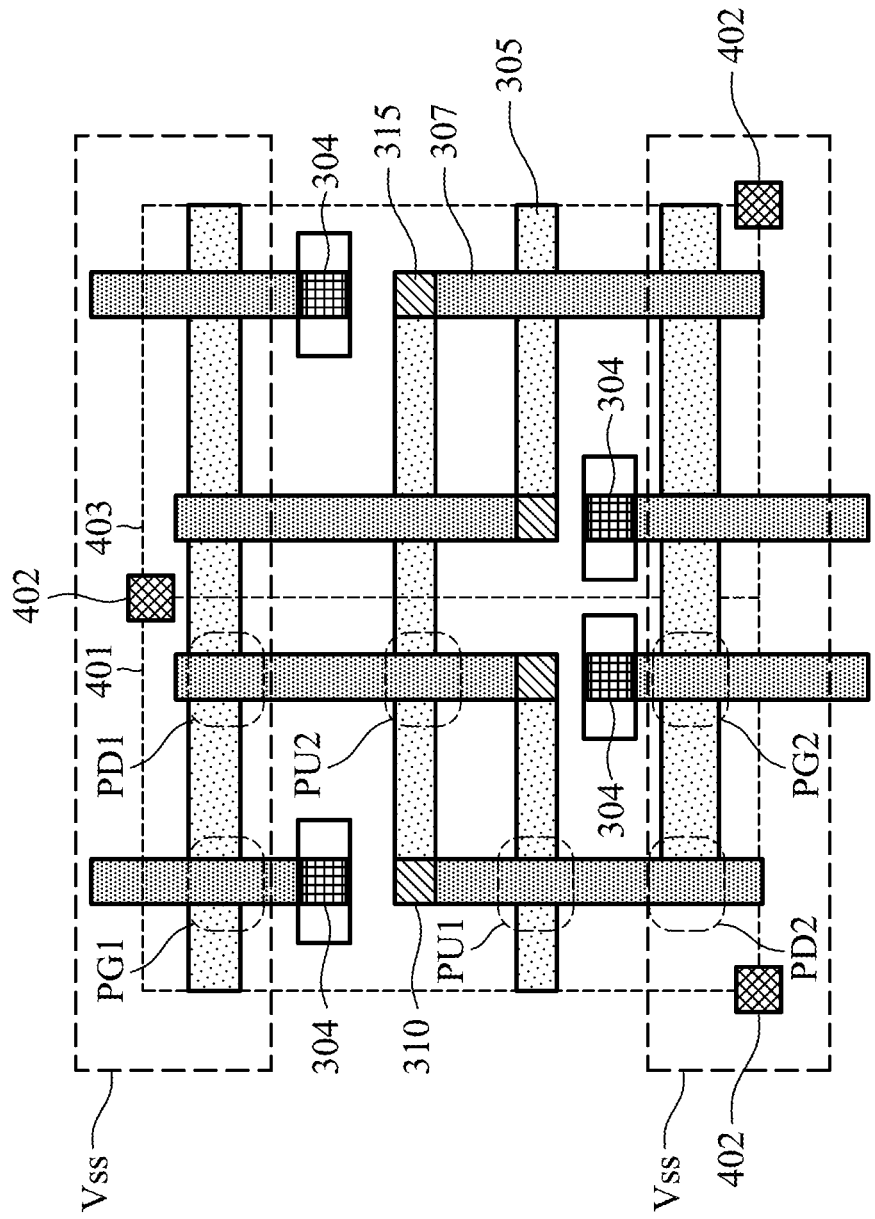
FIGS. 4A and 4B are diagrams showing an illustrative layout of memory cells that use shared bit lines, according to one example of principles described herein.
Figure 4B:
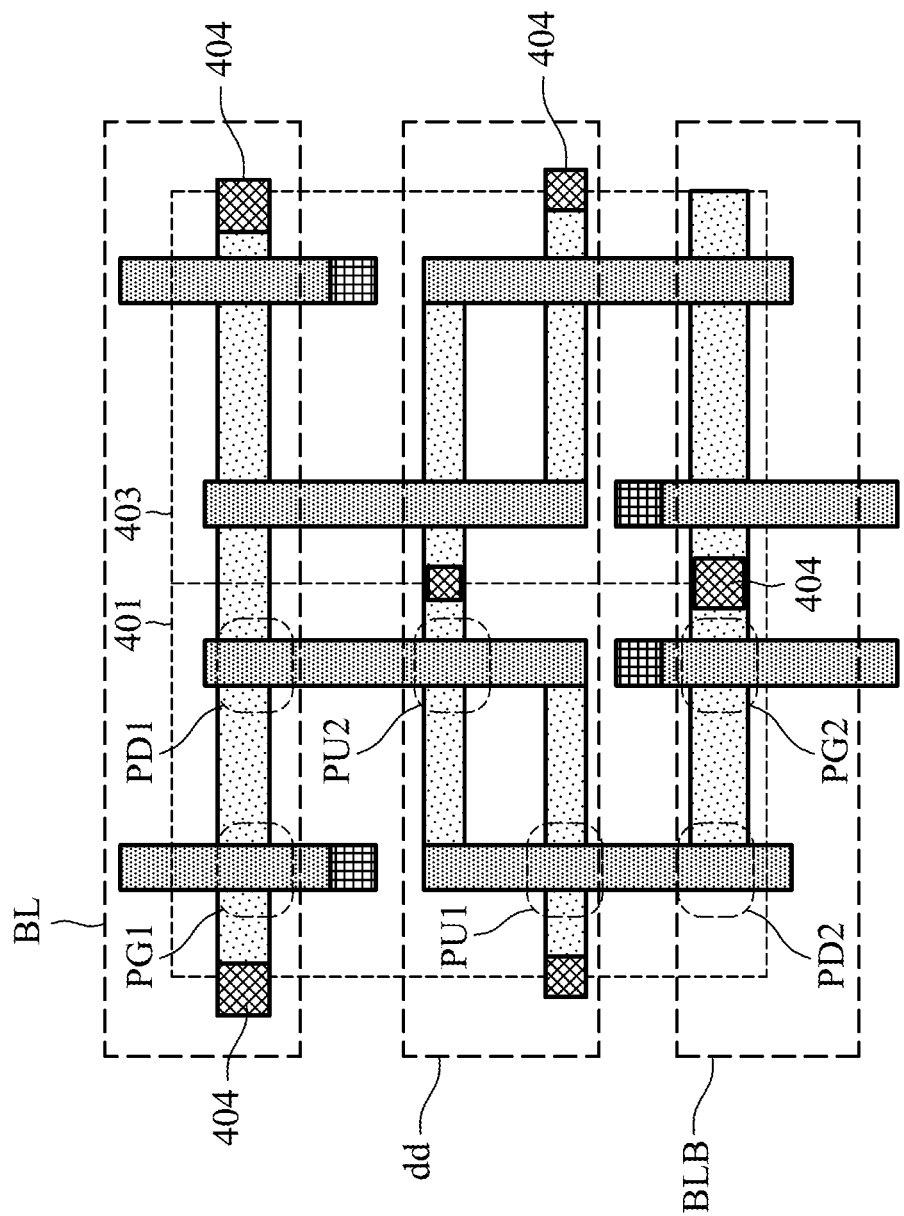

FIGS. 4A and 4B are diagrams showing an illustrative layout of memory cells 401, 403 that use shared bit lines and shared Vss lines. The memory cells 401 and 403 may share similarities to cells 301, 303m with differences noted herein. In this layout embodiment, the Vss lines are formed on the frontside of the substrate and the bit lines BL/BLD and Vdd are formed on the backside of the substrate. FIG. 4A illustrates the via connections 304 that connect the active regions (e.g., source/drain features) to the word lines, which may be formed in a metallization layer above that of the Vss lines. FIG. 4A also illustrates the via connections 402 from the active regions to the Vss power lines formed on the frontside of the substrate. The Vss lines may be shared with adjacent memory cells.

FIG. 4B illustrates the layout of the memory cells 401, 403 with respect to the backside of the substrate. In the present example, the backside of the substrate is processed to form the bit lines BL and BLB, as well as power line Vdd. The bit lines BL and BLB are shared between adjacent cells. Specifically, both of the BL and BLB lines on both sides of the memory cells 401, 403 are shared with adjacent memory cells in adjacent columns. The contacts 404 to the active regions on the backside of the substrate may, as discussed above, be substantially the same width as the active region on which the respective contact 404 lands. For example, the contact landing on the active region (source/drain feature) of the PG-2 and PG-1 transistors may be larger than the contact 404 landing on the active region (source/drain feature) of the PU-1 and PU-2 transistors. The contacts 404 may be formed from the backside of the substrate as discussed below with reference to FIGS. 7A-7G.

In some examples, using principles described herein, the word line resistance may be increased by about 40% and the word line loading may be twice that of conventional structures. In some examples, the word line width may be approximately 50% larger.

Figure 5A:
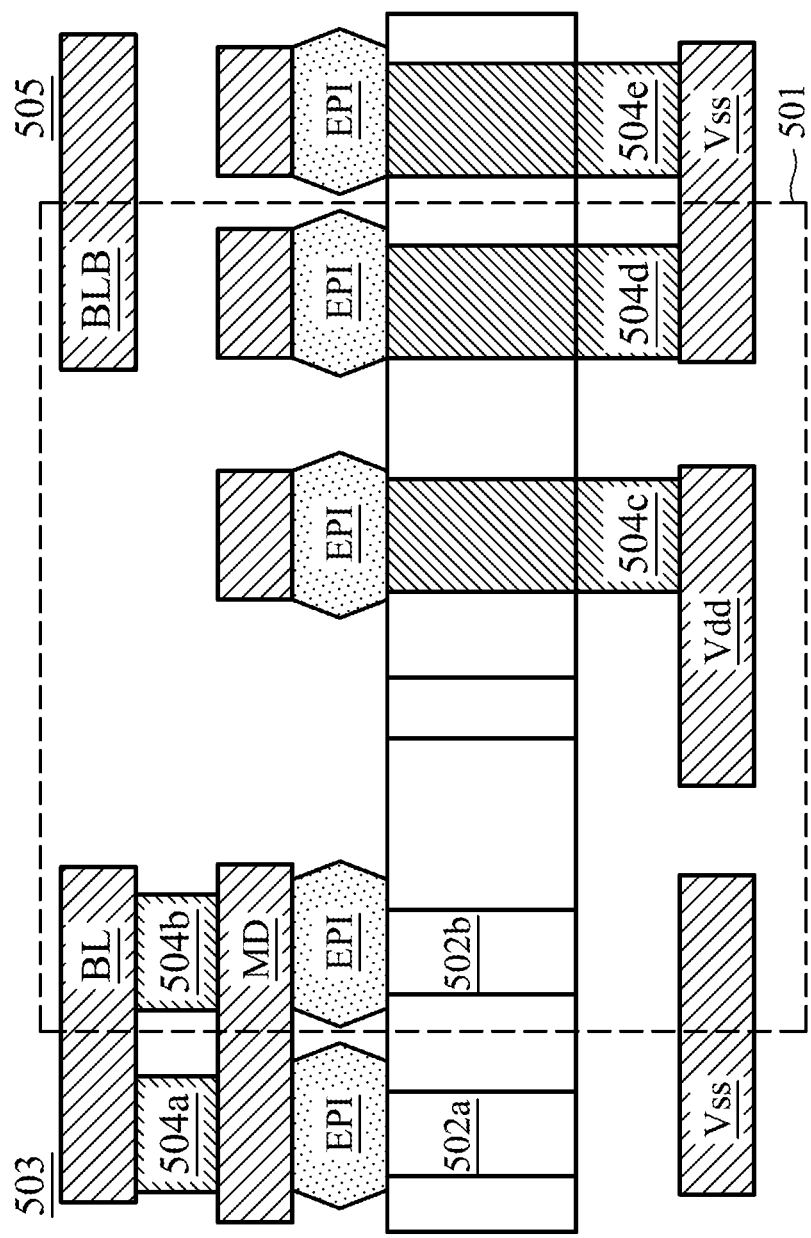
FIG. 5A is a cross-sectional view of the layout of the memory cells shown in FIGS. 3A and 3B, according to one example of principles described herein.

FIG. 5A is a cross-sectional view of a portion of the layout of the memory cells shown in FIGS. 3A and 3B. Specifically, FIG. 5A illustrates a cross-sectional view cut along the border between memory cells 301 and 303. The dotted box 501 shows the cut within a particular column. The components outside the box 501 on the left (shown as 503) are components of memory cells in an adjacent column. Similarly, the components outside the box 501 on the right (shown as 505) are components of memory cells in an adjacent column on the opposite side.

In the present example, each of the power rails Vss and Vdd are positioned on the backside of the wafer. And, the bit lines BL and BLB are positioned on the frontside of the wafer. The active regions 502a, 502b, 502c, 502d, 502e (e.g., fin structures) correspond to the active regions 305 shown in FIGS. 3A and 3B. It is noted that the active regions 502c, 502d, 502e are not illustrated as they are out of plane. The semiconductor material of the active regions 502c, 502d, 502e at the region of the cross-section has been replaced with conductive materials to allow contact to the associated transistor terminal. In some implementations, the active regions 502a, 502b, 502d, and 502e are larger in width (x-direction) than those in the center of device. The active regions have epitaxial source/drain regions (EPI) formed therein. In some embodiments, the fin structures 502 are remaining portions of a bulk silicon formed fin after recessing the fin to prepare for the source/drain features (EPI) formed thereon such as illustrated by 502a and 502b of FIG. 5A. In some embodiments, epitaxial material is grown within the fin structure and subsequently replaced with conductive material to form a conductivity path from the epitaxial source/drain features to a backside metallization layer (e.g., backside M0) thus forming backside via contacts 504c, 504d, 504e. This may be substantially similar to the contact or via 716 described below with reference to FIGS. 7A-7G.

In the present example, a metal contact to diffusion (MD) layer connects the two source/drain features over fin structure 502a and 502b respectively. As can be seen, there is a via 504b interconnecting the source/drain feature (EPI) to the bit line BL. Bit line BL is shared with a transistor from an adjacent memory cell 503 through the interconnect of the source/drain EPI of that transistor to the BL through via 504a. Additionally, there is a via or contact 504c that connects source/drain EPI of active region 502c to the Vdd line. Via 504d connects the source/drain EPI associated with active region 502d to the Vss line on the backside of the substrate. The Vss line is shared with an adjacent memory cell 505. In particular, the source/drain EPI over fin structure 502e from the adjacent memory cell 505 connects to the Vss line through via 504e. While the vias 504a, 504b, 504c, 504d, 504e show direct connections to the power rails and bit lines, some examples may include additional interconnect structures to connect the vias (and thereby the terminals of the transistor device (e.g., source/drain epitaxial feature)) to the power rails and bit lines.

Figure 5B:
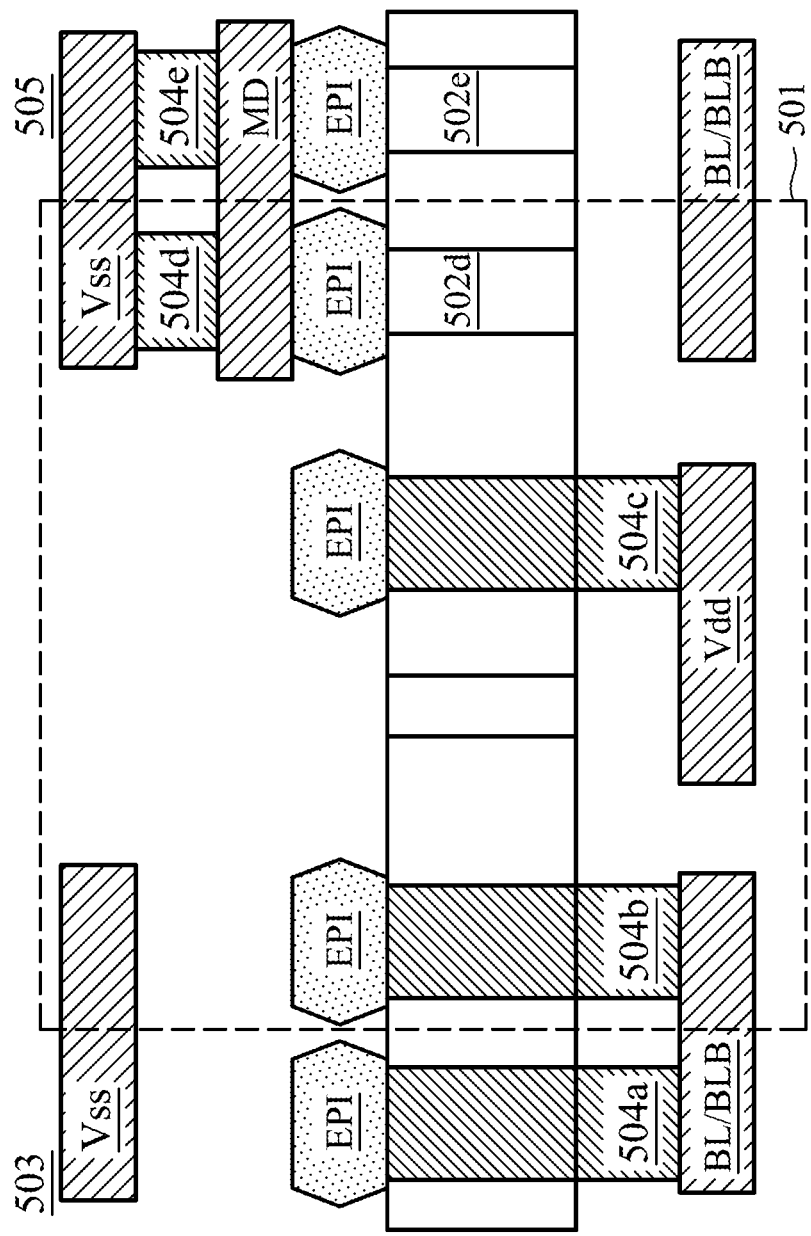
FIG. 5B is a cross-sectional view of the layout of the memory cells shown in FIGS. 4A and 4B, according to one example of principles described herein.

FIG. 5B is a cross-sectional view of the layout of the memory cells shown in FIGS. 4A and 4B. In the present example, the power rails Vss are positioned on the frontside of the wafer. And, the bit lines BL and BLB are positioned on the backside of the wafer, along with Vdd. The fin structures 502a, 502b, 502c, 502d, 502e correspond to the active regions 305 shown in FIGS. 4A and 4B. It is noted that fin structures 502a, 502b, 502c are not illustrated as they are out of plane. The semiconductor material of the active regions 504a, 504b, 504c at this cross-section have been replaced with conductive materials to allow contact to the associated transistor terminal. As can be seen, there is a via 504b connecting the source/drain feature (of active region 502b) to the bit line BL. Bit line BL is shared with a source/drain feature over a fin structure (active region 502a) from an adjacent memory cell 503 through via 504a. Additionally, there is a via 504c that connects the source/drain feature (of active region 502c) to the Vdd line. Via 504d connects the source/drain epitaxial region (of active region 502d) to the Vss line on the backside of the substrate. The Vss line is shared with an adjacent memory cell 505. In particular, source/drain region (of active region 502e) from the adjacent memory cell 505 connects to the Vss line through via 504e. While the vias 504a, 504b, 504c, 504d, 504e show direct connections to the power rails and bit lines, some examples may include additional interconnect structures to connect the transistor features to the power rails and bit lines. The vias 504a, 504b, and 504c may be substantially similar to the contact or vias 716 discussed below with reference to FIGS. 7A-7G.

Figure 6:
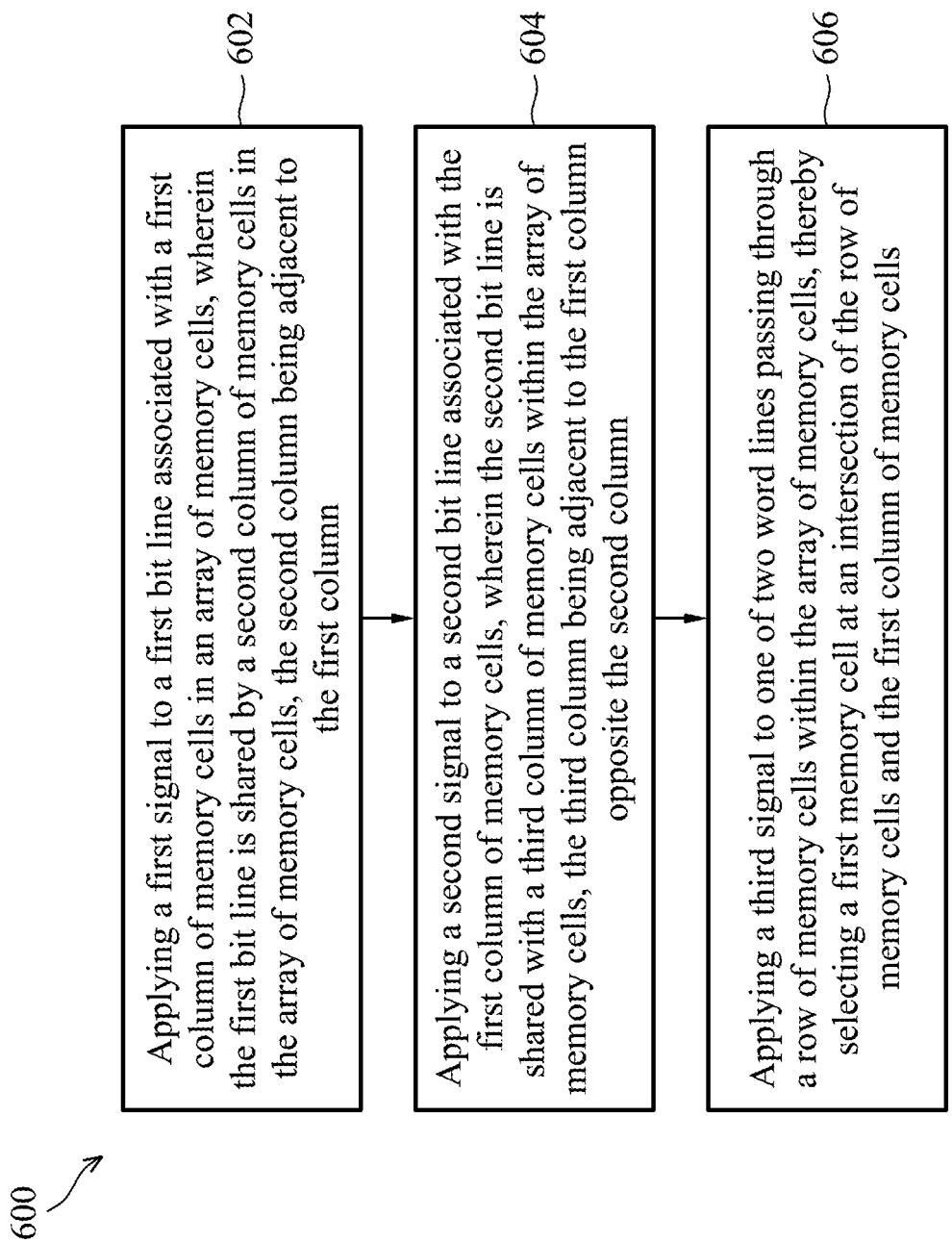
FIG. 6 is a flowchart showing an illustrative method for operating a memory array with shared bit lines, according to one example of principles described herein.

FIG. 6 is a flowchart showing an illustrative method for operating a memory array with shared bit lines. According to the present example, the method 600 includes a process 602 for applying a first signal to a first bit line associated with a first column of memory cells in an array of memory cells, wherein the first bit line is shared by a second column of memory cells in the array of memory cells, the second column being adjacent to the first column. Applying the signal may involve using a control circuit to apply a voltage or an electric current to the first bit line. The first bit line may be, for example, bit line 206a. The first column of memory cells may be 202b. The second column of memory cells may be, for example, column 202a.

The method 600 further includes a process 604 for applying a second signal to a second bit line associated with the first column of memory cells, wherein the second bit line is shared with a third column of memory cells within the array of memory cells, the third column being adjacent to the first column opposite the second column. Applying the signal may involve using a control circuit to apply a voltage or an electric current to the bit lines. The second bit line may be, for example, 206b. The third column may be, for example, 202c.

The method 600 further includes a process 606 for applying a third signal to one of two word lines passing through a row of memory cells within the array of memory cells, thereby selecting a first memory cell at an intersection of the row of memory cells and the first column of memory cells. The two word lines may be, for example, 208a and 208b. The row of memory cells may be, for example, 204a.

In some examples, the first column of memory cells may also share a power line (e.g., Vss) with the second column of memory cells. Additionally, the first column of memory cells may also share another Vss line with the third column of memory cells. In some examples, the size of the bit lines and the Vss lines may be substantially similar. In some examples, the memory cells in the row of memory cells may alternately connect to the two different word lines so that each word line connects to every other memory cell within the row. This allows adjacent memory cells with shared bit lines to be individually selected.

Illustrated in FIGS. 7A to 7H are cross-sectional views of a device 700 in the process of fabrication of a backside contact. The aspects of the device 700 and the backside contact may be applied to any of the transistors discussed above and any of the backside vias or contacts of FIG. 3B, 4B, 5A, or 5B.

Figures 7A, 7B, 7C, 7D:
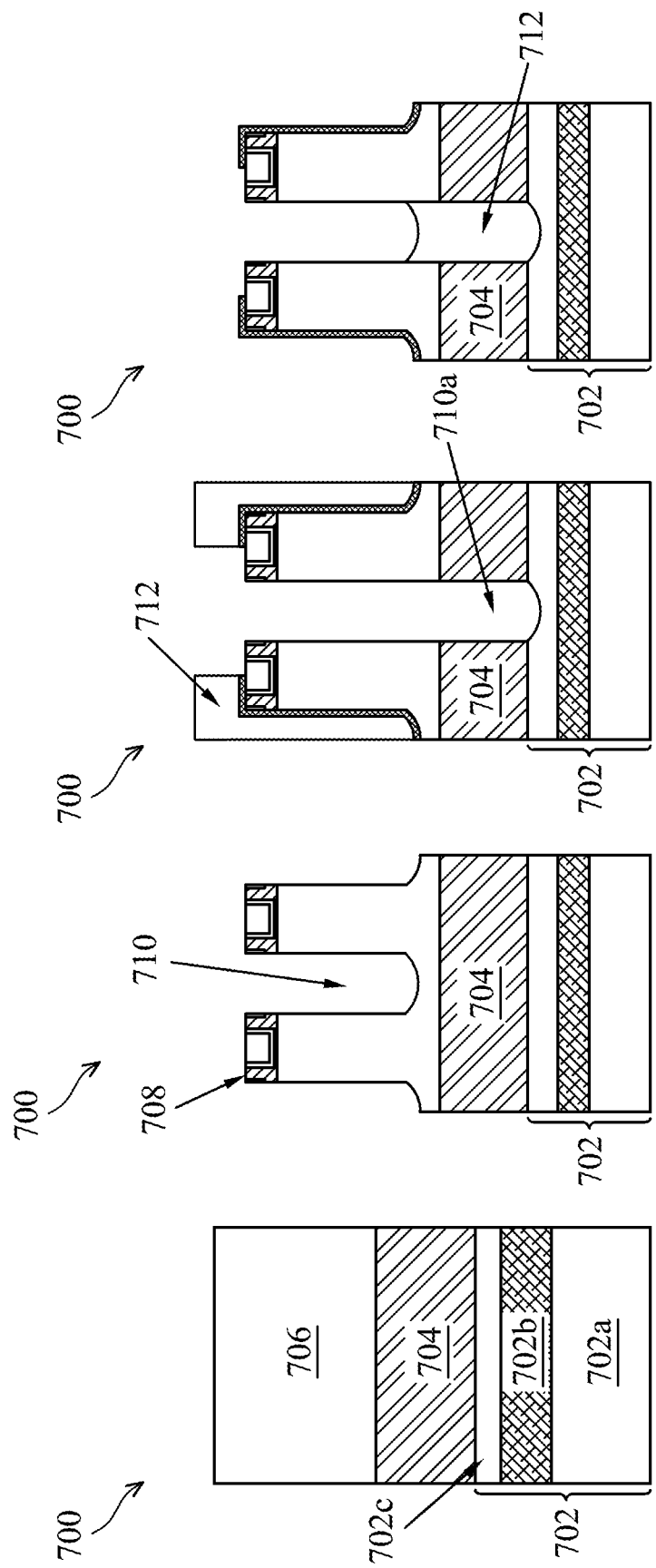
FIGS. 7A, 7B, 7C, 7D, 7E, 7F, and 7G illustrate cross-sectional views of a semiconductor device during or more steps of forming a backside contact or via, according to one example of principles described herein.

In an embodiment, a substrate 702 includes a base portion 702a, an oxide layer (such as a buried oxide layer or BOX) 702b, and an overlying semiconductor layer 702c is provided as illustrated in FIG. 7A. The substrate 702 may be a silicon-on-insulator (SOI) substrate. In some embodiments, the base portion 702a and the overlying semiconductor layer 702c are silicon. Additional semiconductor layers 704 (e.g., silicon germanium) and 706 (e.g., silicon) are formed over the substrate 702. The semiconductor layer 706 may be used to form portions of the active regions. In an embodiment, the semiconductor layer 706 is a plurality of stacks layers such as suitable for forming nanowire channel regions in a gate-all-around (GAA) device.

From this base structure, features of semiconductor device are formed on a front side of the substrate, illustrated in FIG. 7B having a plurality of gate structures 708 formed over the active region. During the stage of FIG. 7B, in some implementations, the gate structures 708 are dummy gate structures. Adjacent the gate structures, the semiconductor layer 706 is recessed to form a source/drain recesses 710. The source/drain recesses 710 may be formed on both sides of the gate structure 708. In subsequent steps, source/drain features may be formed in source/drain recesses 710 such as by epitaxial growth.

Referring now to FIG. 7C, a patterning material or masking element 712 is formed to mask certain regions of the substrate 702 and provides openings over certain source/drain recesses 710 where a backside contact or via is to be connected to the feature. Through the openings in the masking element 712, the respective source/drain region 710 is extended as shown by source-side recess 710a of FIG. 7C by a suitable selective etching process.

Figures 7E, 7F, 7G:
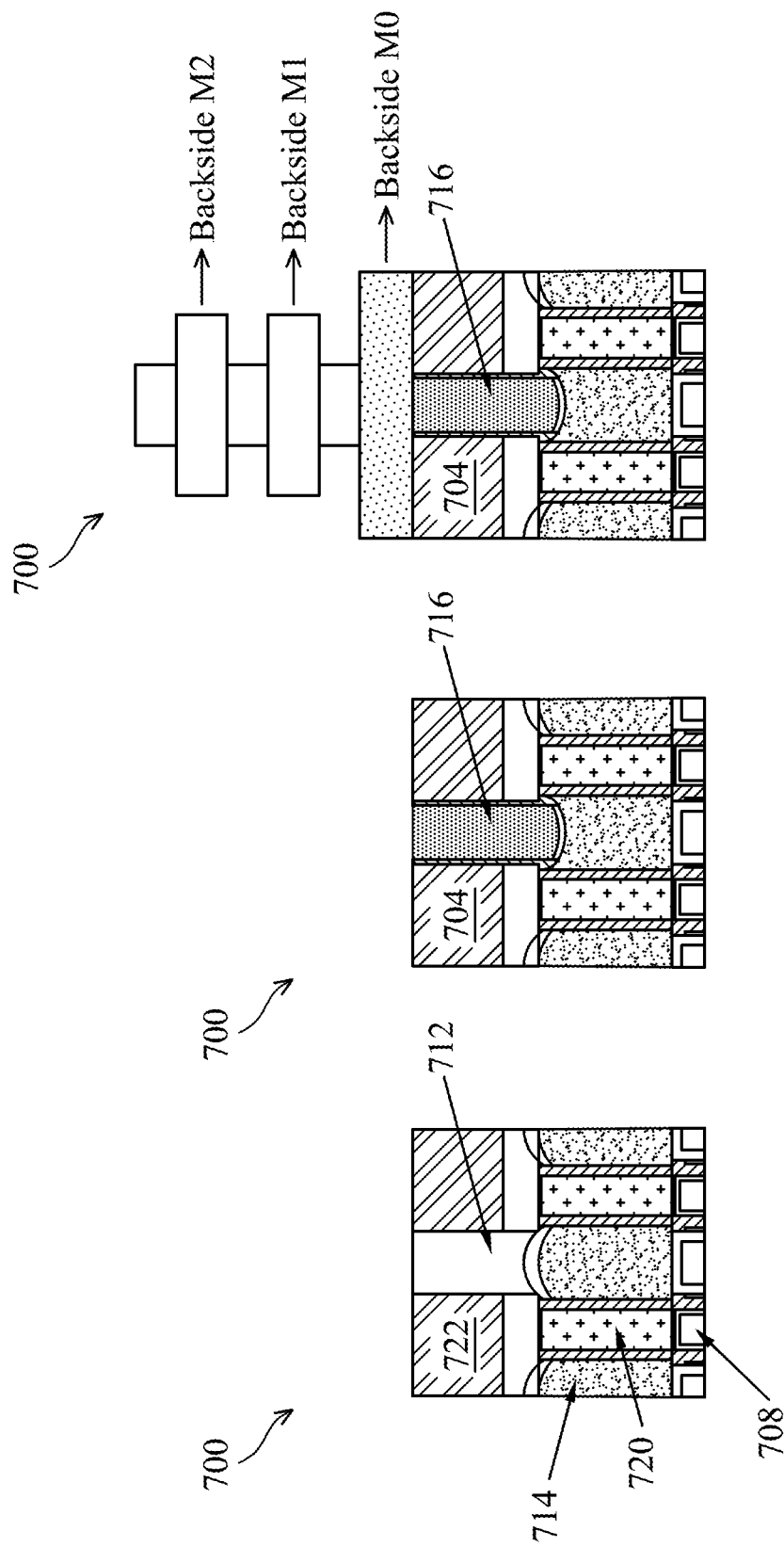

In an embodiment, as illustrated in FIG. 7D, an undoped silicon epitaxial material 712 is grown in the extended source-side recess 710a. The undoped silicon epitaxial material 712 may be a sacrificial layer latter removed to provide the backside contact or via. In other embodiments, other materials that provide for selectivity As illustrated in FIG. 7E, the substrate is then flipped for backside processing. In some embodiments, the substrate is attached to a carrier substrate to process the backside of the substrate. It is noted that further processing is typical prior to processing the backside of the structure including release of active region in the form of nanowires in the case of a GAA structure, formation of a metal gate structure such as by a replacement gate process, epitaxial growth of source/drain features, formation of frontside contacts and vias, and a frontside multi-layer interconnect (MLI) that includes certain frontside metallization layers including as specified in FIGS. 3A, 4A, 5A and 5B. Source/drain epitaxial features 714 are illustrated adjacent the gate structure 708 (which may be metal gate structures). In some embodiments, the cross-sectional view of FIGS. 7A to 7G are offset from the gate structure and thus, the gate structure itself is not illustrated. Thus, between the source/drain epitaxial features 714 may be an insulating structure such as a shallow trench isolation (STI) feature 720. The STI features 720 may be substantially similar to the regions interposing the active areas as illustrated in FIGS. 3A-5B.

In one example of beginning the backside processing, a removal operation is applied to thin down the substrate 702 from the backside. The removal operation may include grinding, chemical mechanical polishing (CMP) and etch such as wet etch in a combination to make thinning process efficient. The semiconductor layer 704 may provide an etch stop to the thinning of the substrate so that the thinning process of the operation can stop properly. In some examples for enhanced throughput, the polishing process includes a grinding process with a higher polishing rate and then a CMP process with a higher polishing quality.

During the backside processing of the device 700, as illustrated in FIG. 7E, the substrate 702 is thinned to expose a backside of the silicon epitaxial material 712. Due to the etch selectivity between the silicon epitaxial material 712 and the surrounding semiconductor layer 704 (e.g., SiGe), a contact or via 716 of conductive material may be formed replacing the silicon epitaxial material 712 as shown in FIG. 7F. The contact 716 may include a silicide layer interposing a conductive material of the contact 716 (e.g., W) and the source/drain epitaxial features 714. The contact 716 may be substantially similar to any of the backside contact or vias described above with reference to FIGS. 3B, 4B, 5A, and 5B. The contact 716 includes conductive material such as Ti, TiN, TaN, Co, W, Al, Cu, or combination. The formation of the backside contact feature includes deposition of one or more conductive material and CMP according to some examples. The deposition may be implemented through proper deposition technique, such as CVD, ALD, plating, CVD or other suitable method. The formed backside contact feature 120 has a thickness similar to that of the isolation layer discussed below, such as in a range between 10 nm and 30 nm.

In some implementations, prior to forming the contact or via 716 accessing the source/drain feature 714 from the backside, the semiconductor material 704 is removed and replaced with isolation layer 722. See FIG. 7E. The isolation layer may be a dielectric material layer and may include silicon oxide, silicon nitride, silicon oxynitride, low-k dielectric material, other suitable dielectric material or a combination thereof. The isolation layer may be formed by a suitable deposition technology, such as CVD, ALD, flowable CVD (FCVD) and may be followed by a CMP process. In some embodiments, the isolation layer includes a thickness ranging between 10 nm and 30 nm.

As illustrated in FIG. 7G, additional layers of a backside multi-layer interconnect can be formed over the contact 716. The additional backside MLI can include metallization layers that provide for in some implementations, Vss, Vdd, BL, and/or BLB as discussed above. The backside signal or power lines may be formed on any suitable metallization layer such as M0, M1 or M2. Additional dielectric layers or a backside ILD (BILD) layer may be formed. The formation of the BILD layer may include deposition and CMP in some embodiments. Then, the BILD may be patterned to form trenches corresponding to the backside rails (e.g., Vss and Vdd lines) or signal lines as discussed above with reference to FIGS. 3A and 4A. The conductive lines may include Ti, TiN, TaN, Co, W, Al, Cu, combinations thereof. and other suitable materials. Other fabrication steps may be implemented before, during and after the operations discussed here.

Figure 8:
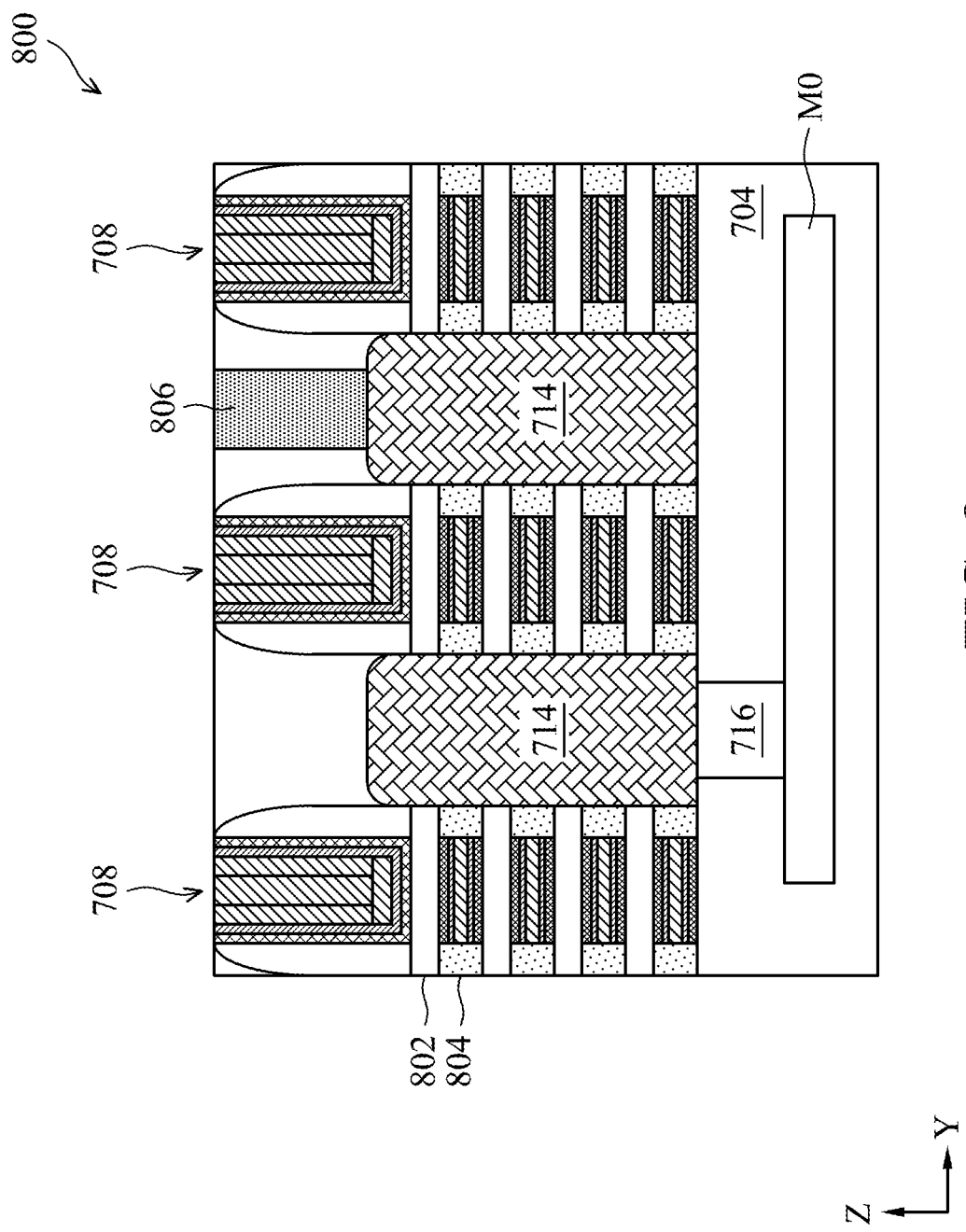
FIG. 8 illustrates a cross-sectional view of a gate-all-around transistor that may be implemented in memory cells, according to one example of principles described herein.

FIG. 8 illustrates an embodiment of a semiconductor device formed as a gate-all-around transistor that may be implemented as any one or all the transistors of FIGS. 3A-7G (e.g., PU, PD, PG). FIG. 8 illustrates a cross-sectional view of a device 800 having a frontside contact 806 to a terminal of the transistor and a backside contact 716 to another terminal of the transistor. The frontside contact or via 806 may be substantially similar to any of the frontside contacts of FIGS. 3A and 4A that contacts a source/drain region of a transistor to form the SRAM device. The backside contact or via 716 may be substantially similar to any of the backside contacts of FIGS. 3B and 4B that contact a source/drain region of a transistor to form the SRAM device. In some embodiments, the backside contact 716 is formed according to one or more steps of FIGS. 7A to 7G. The backside metallization layer (M0) may provide any one of the backside metallization layers including Vss or Vdd of FIGS. 3A and 3B, or Vdd, Bit line, Bit line Bar of FIG. 4B. Above the gate 708 is formed additional MLI metallization layers that may provide the signal or power lines described on the frontside of the device of FIG. 3A or 4A. Whether they are formed on the frontside or backside of the device as discussed herein, the device 800 be included in a memory cell that shares one or more signal or power lines with an adjacent cell as discussed above.

The device 800 provides a gate-all-around device or transistor. In doing so, the GAA device 800 includes a plurality of channel regions 802 extending between epitaxial source/drain regions 714. The gate structure 708, including gate dielectric and gate electrode layers, extends around each of the channel regions 802. The channel regions 802 may be in the form of nanowires, nanobars, or other nano-sized structures. Inner spacers 804 of dielectric material interpose the gate structure 708 and the source/drain region 714.

By using principles described herein, memory arrays may exhibit better performance without increasing the size. Specifically, by sharing the bit lines between adjacent cells, the resistance and capacitance of such lines may be substantially reduced. In one example, the ratio of bit line length to resistance in conventional structures is reduced by about 25-33%. Furthermore, the bit line loading may be approximately half that of conventional structures. In some examples, the capacitance is reduced by about 37%. This reduced resistance and capacitance allows for faster operating speeds. For example, operating speeds can be increased by about 20%. Thus, data can be written to or read from the memory cell at faster rates.

In an embodiment discussed herein, a circuit comprises a plurality of memory cells and a first bit line connected to a first column of memory cells of the plurality of memory cells, and a second bit line connected to the first column of cells. The first bit line is shared with a second column of memory cells adjacent to the first column of memory cells. The second bit line is shared with a third column of cells adjacent to the first column of cells opposite the second column of cells.

In a further embodiment of the circuit, two word lines pass through each row of cells. In an embodiment, each of the two word lines connect to alternating cells within each row in a staggered manner. In some implementations, a width of the first bit line and the second bit line is greater than a width of the word line. For example, the width of the first bit line and the second bit line may be approximately 50% greater than the width of the word line. In an embodiment of the device, the first bit line and the second bit line are formed on a frontside of a substrate. In a further implementation, the Vss line and a Vdd line are formed on a backside of the substrate opposite the frontside.

In an embodiment, a first Vss line passing through the first column of memory cells is shared by shared with memory cells in the second column of memory cells. In a further device, a second Vss line passes through the first column of memory cells is shared by shared with memory cells in the third column of memory cells. In another embodiment, the bit line, the second bit line, and a Vdd line are formed on a backside of a substrate. In a further embodiment, Vss lines are formed on a frontside of the substrate opposite the backside.

In another of the broader embodiments, a memory cell is provided that includes a first pass gate transistor connected to a first bit line. The first bit line is shared with a first adjacent memory cell in a same row as the memory cell. A second pass gate transistor is connected to a second bit line. The second bit line is shared with a second adjacent memory cell in the same row as the memory cell, and on an opposite side from the first adjacent memory cell. A first word line extends through the memory cell and connecting to the first pass gate transistor and the second pass gate transistor. A second word line extends through the memory cell and connects to the first adjacent memory cell and the second adjacent memory cell.

In an embodiment of the memory cell, for each memory cell within a row of memory cells, only one of the first word line or the second word line is connected to that cell. In an embodiment, the first bit line, the second bit line, and Vdd are formed on a backside of a substrate and a Vss line is formed on a frontside of the substrate. In an implementation, the first bit line and the second bit line are formed on a frontside of a substrate and a Vss line and a Vdd line are formed on a backside of the substrate. In an implementation, the first bit line is wider than the word line. In some implementations, the bit line is at least 50% wider than the word line.

In another of the broader embodiments, a method is provided that includes applying a first signal to a first bit line associated with a first column of memory cells in an array of memory cells. The first bit line is shared by a second column of memory cells in the array of memory cells, the second column being adjacent to the first column. The method includes applying a second signal to a second bit line associated with the first column of memory cells, wherein the second bit line is shared with a third column of memory cells within the array of memory cells, the third column being adjacent to the first column opposite the second column. A third signal is applied to one of two word lines passing through a row of memory cells within the array of memory cells, thereby selecting a first memory cell at an intersection of the row of memory cells and the first column of memory cells. In an embodiment, the method includes selecting a second memory cell in the row of memory cells by applying a fourth signal to the other of the two word lines, the second memory cell being adjacent the first memory cell. In an embodiment, the first bit line and the second bit line are an opposite sides of a wafer from a power line connected to the first column of memory cells.

In an implementation, a method includes applying a first signal to a first bit line associated with a first column of memory cells in an array of memory cells. The first bit line is shared by a second column of memory cells in the array of memory cells, the second column being adjacent to the first column. A second signal is applied to a second bit line associated with the first column of memory cells. The second bit line is shared with a third column of memory cells within the array of memory cells, the third column being adjacent to the first column opposite the second column. A third signal is applied to one of two word lines passing through a row of memory cells within the array of memory cells, thereby selecting a first memory cell at an intersection of the row of memory cells and the first column of memory cells.

In a further implementation, a second memory cell is selected in the row of memory cells by applying a fourth signal to the other of the two word lines, the second memory cell being adjacent the first memory cell. In an embodiment, the first bit line and the second bit line are on opposite sides of a wafer from a power line.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a first pass gate transistor formed over a substrate, the first pass gate transistor connected to a first bit line, the first bit line being shared with a first adjacent memory cell in a same row as a memory cell;
   a second pass gate transistor formed over the substrate, the second pass gate transistor connected to a second bit line, the second bit line being shared with a second adjacent memory cell in the same row as the memory cell, and on an opposite side from the first adjacent memory cell;
   a first word line connecting to the first pass gate transistor and the second pass gate transistor; and
   a second word line extending through the memory cell and connecting to the first adjacent memory cell and the second adjacent memory cell, wherein at least one of the first bit line, the second bit line or a power line is a metallization line formed on a backside of the substrate, and
   wherein at least one of the first pass gate transistor or the second pass gate transistor is a gate all around (GAA) transistor having a backside contact extending to the metallization line.

2. The semiconductor device of claim 1, wherein for each memory cell within a row of memory cells, only one of the first word line or the second word line is connected to that cell.

3. The semiconductor device of claim 1, wherein each of the first bit line, the second bit line, and the power line of a Vdd line are formed on the backside of the substrate and a Vss line is formed on a frontside of the substrate.

4. The semiconductor device of claim 1, wherein the first bit line and the second bit line are formed on a frontside of the substrate and the power line of a Vss line and a Vdd line are formed on the backside of the substrate.

5. The semiconductor device of claim 1, wherein the first bit line is wider than the first word line.

6. The semiconductor device of claim 1, wherein the backside contact has a first end contacting an epitaxial region.

7. The semiconductor device of claim 6, wherein the backside contact has a second end opposite the first end contacting the metallization line.

8. A method of fabrication of a semiconductor device, comprising:
   forming a first semiconductor layer over a substrate;
   forming a second semiconductor layer over the first semiconductor layer;
   forming features of the semiconductor device on the second semiconductor layer, wherein the features include a first gate structure and a second gate structure;
   etching a first opening extending through the first semiconductor layer and the second semiconductor layer and laterally disposed between the first gate structure and the second gate structure;
   depositing a first epitaxial material in the first opening adjacent the first semiconductor layer;
   thinning the substrate to expose the first epitaxial material and the first semiconductor layer;
   after thinning, removing the first epitaxial material to form a second opening;
   depositing metallization in the second opening to form a contact; and
   forming an interconnect line on connected to the contact.

9. The method of claim 8, wherein after depositing the first epitaxial material, depositing a second epitaxial material over the first epitaxial material, wherein the second epitaxial material is suitably doped to provide a source/drain region associated with at least one of the first gate structure and the second gate structure.

10. The method of claim 9, wherein a first end of the contact interfaces the second epitaxial material and a second end of the contact interfaces the interconnect line.

11. The method of claim 8, wherein the depositing the first epitaxial material includes depositing undoped silicon.

12. The method of claim 8, wherein the forming the interconnect line includes forming at least one of a power line or a bit line.

13. The method of claim 8, wherein the first gate structure and the second gate structure are part of a memory cell, and wherein the memory cell comprises:
    a first transistor including the first gate structure, wherein the first transistor is connected to the interconnect line providing a first bit line;
    a second transistor connected including the second gate structure, wherein the second transistor is connected to the first bit line.

14. The method of claim 8, further comprising:
    prior to depositing metallization in the second opening, replacing the first semiconductor layer with an isolation layer.

15. The method of claim 8, further comprising:
    depositing a second epitaxial material over the first epitaxial material in the first opening; and
    forming a silicide layer between the contact and the second epitaxial material.

16. A semiconductor device, comprising:
    a plurality of memory cells;
    a first bit line extending in a first direction and connected to a first column of memory cells of the plurality of memory cells, wherein the first bit line is shared with a second column of memory cells adjacent to the first column of memory cells;
    a second bit line extending in the first direction connected to the first column of memory cells, wherein the second bit line is shared with a third column of memory cells adjacent to the first column of memory cells opposite the second column of memory cells;
    at least one power line extending in the first direction, wherein the at least one power line passes through the first column of memory cells and is shared with memory cells in the second column of memory cells; and wherein at least one power line is disposed on a backside of a substrate.

17. The device of claim 16, wherein the first bit line and the second bit line are disposed on the backside of the substrate.

18. The device of claim 17, further comprising:

an active region extending in the first direction, and a contact extending from the at least one power line to the active region, wherein the contact is substantially a same width as the active region.

19. The device of claim 18, further comprising, another active region extending in the first direction, and another contact extending from the first bit line to the another active region, wherein the another contact is substantially a same width as the another active region, wherein the contact is greater in width and the another contact.

20. The device of claim 19, wherein the at least one power line disposed on the backside of the substrate is Vdd, and at least one other power line of Vss is disposed on a frontside of the substrate.

* * * * *